(12) United States Patent
Leung

(10) Patent No.: US 7,411,816 B2
(45) Date of Patent: Aug. 12, 2008

(54) ENHANCED MRAM REFERENCE BIT PROGRAMMING STRUCTURE

(75) Inventor: Eric T. Leung, New Hope, MN (US)

(73) Assignee: Honeywell International Inc., Morristown, NJ (US)

( * ) Notice: Subject to any disclaimer, the term of this patent is extended or adjusted under 35 U.S.C. 154(b) by 0 days.

(21) Appl. No.: 11/335,344

(22) Filed: Jan. 19, 2006

(65) Prior Publication Data

US 2007/0165451 A1     Jul. 19, 2007

(51) Int. Cl.
*G11C 11/00* (2006.01)
(52) U.S. Cl. .................. 365/158; 365/173; 365/210; 257/422
(58) Field of Classification Search ................ 365/158, 365/173, 210; 257/422
See application file for complete search history.

(56) References Cited

U.S. PATENT DOCUMENTS

| | | | | |
|---|---|---|---|---|
| 6,055,178 | A | 4/2000 | Naji | 365/158 |
| 6,720,597 | B2 | 4/2004 | Janesky et al. | 257/295 |
| 6,740,947 | B1 | 5/2004 | Bhattacharyya et al. | 257/421 |
| 6,791,872 | B2 | 9/2004 | Bloomquist et al. | 365/158 |
| 6,803,274 | B2* | 10/2004 | Sharma et al. | 438/257 |
| 6,885,074 | B2 | 4/2005 | Durlam et al. | 257/422 |
| 6,927,072 | B2 | 8/2005 | Molla et al. | 438/3 |
| 7,009,874 | B2 | 3/2006 | Deak | 365/158 |
| 2006/0023494 | A1* | 2/2006 | Jeong et al. | 365/158 |
| 2007/0030723 | A1* | 2/2007 | Chen et al. | 365/158 |

OTHER PUBLICATIONS

Durlam et al., "A Low Power 1Mbit MRAM Based on 1T1MTJ Bit Cell Integrated with Copper Interconnects," Motorola Labs and Motorola Semiconductor Products Sector, To be published at VLSI Symposium 2002.
Park, M.H. et al., "Magnetic Element Shape for Magnetic Random Access Memory (MRAM)", 11th Annual NASA Symposium on VLSI Design, May 28-29 (2003), Moscow, Idaho, USA.

* cited by examiner

*Primary Examiner*—Hoai V. Ho
(74) *Attorney, Agent, or Firm*—McDonnell Boehnen Hulbert & Berghoff LLP

(57) ABSTRACT

An MRAM circuit includes an MRAM array having a plurality of operational MRAM elements and a reference cell made up of one or more reference MRAM elements. A plurality of program lines within a first region are cladded with a flux-concentrating layer configured to focus a generated magnetic field while the portions of the program lines within a second region are uncladded so that the generated magnetic field is unfocused. Generally, the first region is associated with the operational MRAM elements and the second region is associated with the reference cell.

14 Claims, 3 Drawing Sheets

ENHANCED MRAM REFERENCE BIT PROGRAMMING STRUCTURE

GOVERNMENT RIGHTS

The United States Government has acquired certain rights in this invention pursuant to Contract No. DTRA01-00-C-0002 awarded by the Defense Threat Reduction Agency (DTRA).

FIELD

The invention relates to the configuration of magnetic random access memory (MRAM).

BACKGROUND

In a typical MRAM element, the relative orientations of magnetic directions of ferromagnetic layers define a binary state of the device. The resistance across an element is generally lowest when the magnetic directions of the ferromagnetic layers are in a parallel orientation and highest when the magnetic directions are in an antiparallel orientation.

One type of MRAM device is commonly referred to as a "spin valve." GMR devices, including spin valves, can be used as data storage elements in magnetic random access memory (MRAM) devices. In this regard, exemplary MRAM applications of GMR devices are described in U.S. Pat. Nos. 6,147,922; 6,175,525; 6,178,111; 6,493,258, and U.S. Pat. App. Pub. No. 2005/0226064, all of which are incorporated herein by reference. Other types of MRAM devices include the magnetic tunnel junction (MJT), pseudo spin valve, and ring-shaped MRAM.

A spin valve typically includes two or more ferromagnetic layers that are separated by a thin layer of a non-magnetic metal (often copper) and also includes an antiferromagnetic layer that "pins" the magnetization direction of one of the ferromagnetic layers. FIG. 1 illustrates (in a simplified form) the layers in a typical spin valve 10 as seen from a side view. As shown in FIG. 1, spin valve 10 includes ferromagnetic layers 12 and 14 separated by a nonmagnetic layer 16. In a typical arrangement, one of the magnetic layers is configured to be a fixed layer 14. Fixed layer 14 is adjacent to an antiferromagnetic layer 18, such that the magnetization direction of fixed layer 14 is "pinned" in a particular orientation. The arrow in fixed layer 14 indicates an exemplary pinned orientation, though, in general, the orientation could be pinned in either direction. Thus, the magnetization direction of fixed layer 14 remains relatively fixed when operational magnetic fields are applied to spin valve 10. A second magnetic layer 12 is termed a free layer 12. In contrast with the fixed layer 14, the magnetization direction of free layer 12 is free to switch between parallel and antiparallel orientations, as indicated by the double-arrow symbol in free layer 12. By applying an appropriate magnetic field to spin valve 10, the magnetization direction of free layer 12 can be inverted while the magnetization direction of fixed layer 14 remains the same.

At least for MJT elements, the magnetic fields may applied by sending a current through copper interconnects that are cladded with a high permeability layer used to focus magnetic flux. Studies have shown that cladding increases the strength of the magnetic field in the direction of the element, and thus can be used to reduce the power required for programming the elements. This process is discussed in more detail in "Durlam M, *A low power 1 Mbit MRAM based on 1T1MJT bit cell integrated with copper interconnects*, published at VLSI Symposium 2002" all of which is incorporated herein by reference. For instance, in Durlam paper, shows that the value of a normalized magnetic field may more than double or approximately double.

One or more reference elements may included in an MRAM circuit and used in determining a logical state of the various operational elements. It is generally important to design the reference bit to be almost identical to the data bit yet with enough differences to maintain its fixed logical state for reliable and robust operation. Because cladding increases and focuses the applied magnetic field, cladding can also inadvertently cause a reference element to switch its logical state—leading to operational error.

SUMMARY

MRAM reference elements are structured to be similar to the corresponding MRAM operational elements (i.e., elements used in operation for data storage and/or retrieval). As such, during operation the reference elements could be inadvertently toggled. This is especially true when cladding is used to focus and amplify the magnetic field applied on the operational elements.

With this issue in mind, an MRAM circuit is disclosed having program lines that are cladded in the portion of the circuit associated with the operational elements, but not cladded in the portion of the circuit associated with the reference elements. By cladding only the program lines associated with operational elements and not those portions associated with the reference elements, a lower current can generate the necessary magnetic field to toggle an operational element. On the other hand, that same current level would not generate enough magnetic field on the uncladded reference element portion to toggle the reference element.

Because the reference element will require a higher current level to toggle its logical state, different current generator circuitry may be used to supply the higher current levels.

DETAILED DESCRIPTION OF THE DRAWINGS

Figure 1:
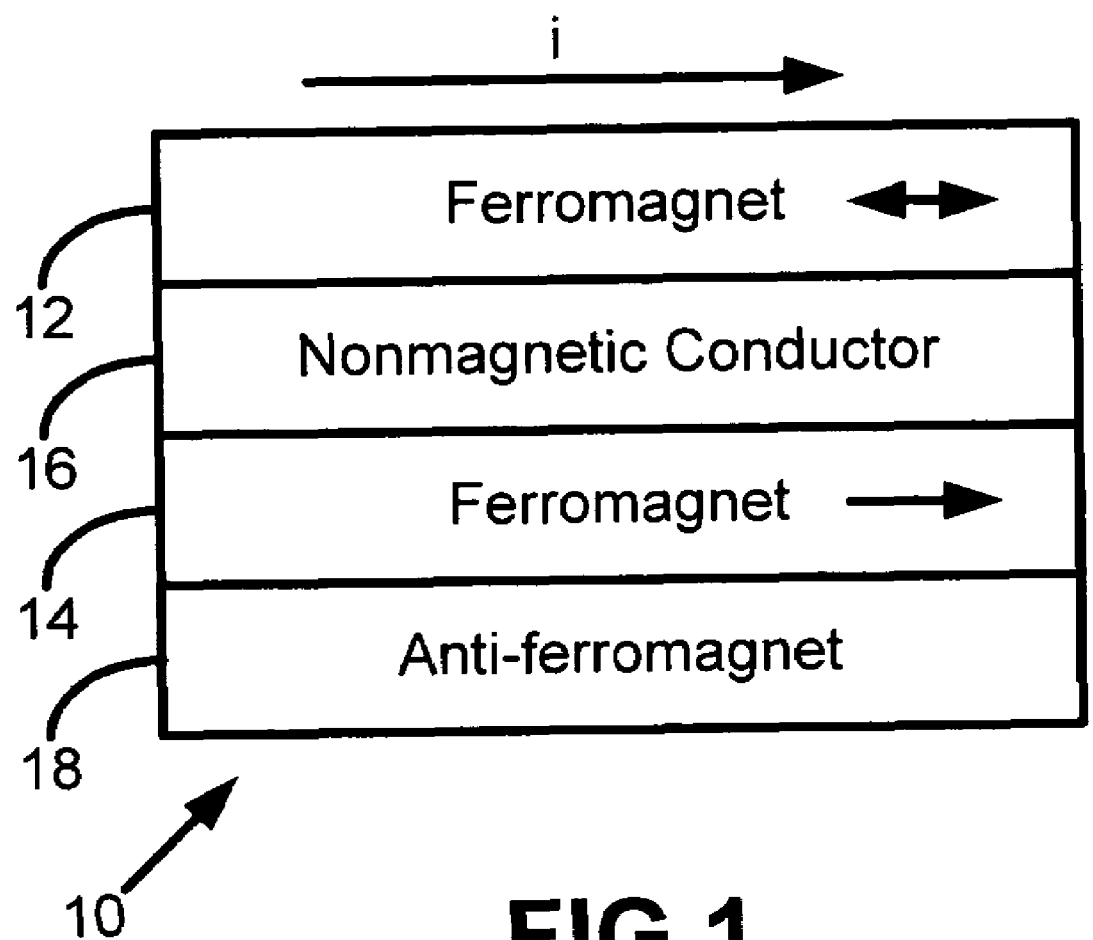
FIG. 1 is a schematic diagram of the layers of a prior art spin valve.
Figure 2:
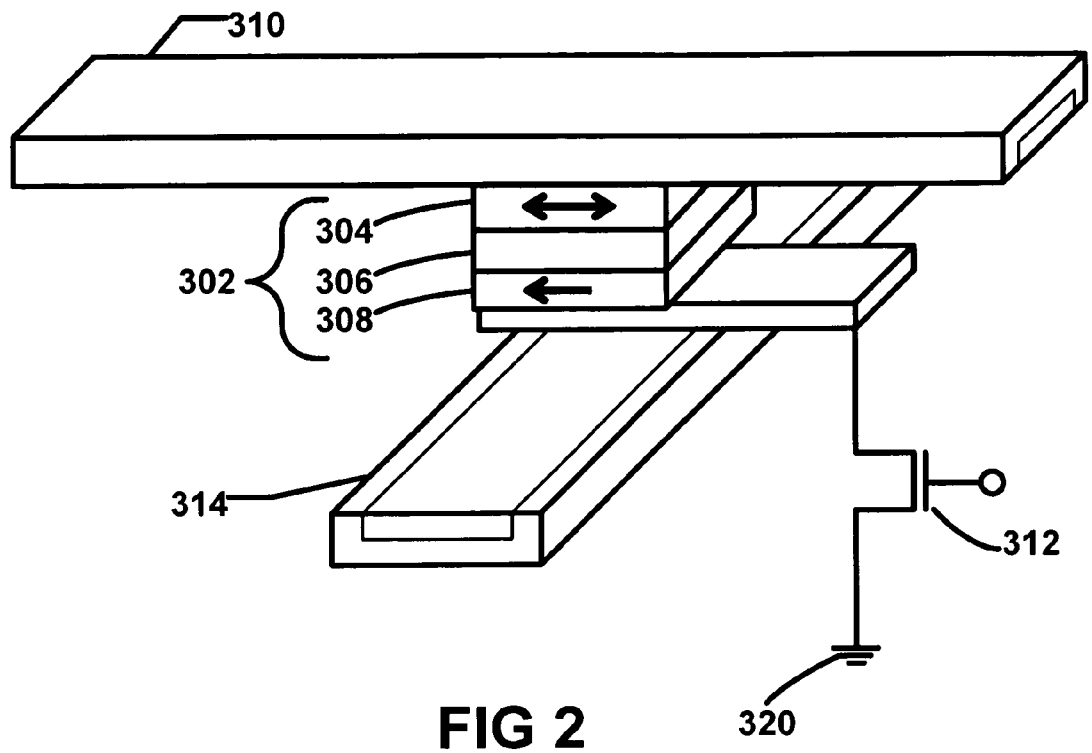
FIG. 2 is a perspective view of an operational element having cladded program lines according to an embodiment of the invention.

Referring to the drawings, FIG. 2 is a perspective view of showing relative orientation of an operational element having cladded program lines. Here, the operational element 302 is a magnetic tunnel junction. The operational element 302 includes a free layer 304, tunnel barrier 306 (e.g., a dielectric), and fixed layer 308. A first side of the operational element 302 is coupled to a cladded bit line 310 while a second side of the operational element 302 is coupled to ground 320 via a switch 312 (e.g., a transistor).

A cladded digit line 314 is arranged near the operational element 302, but is electrically insulated from the operational element 302. As shown, the cladded bit line 310 and cladded digit line 314 may be arranged so that one line runs perpendicularly to the other. Here, the operational element 302 is arranged in a "dual select" configuration. As such, in order to switch a logical state of the operational element, currents are passed through both the cladded bit line 310 and the cladded digit line 314.

The cladded bit line 310 and cladded digit line 314 are collectively termed 'program lines' as they may be used to switch (toggle) and/or read the logical state of the operational element 302. Each line is inlaid copper interconnects with flux concentrating cladding used to focus the magnetic field generated by a current passing through. In an embodiment, flux-concentrating layer is composed of a thin layer of soft ferromagnetic material that is integrated into the inlaid copper interconnect process. Studies by Durlam, et al., show that cladding the lines can reduce required current by approximately a factor of two as compared to lines without cladding. (See FIG. 2).

Figure 3:
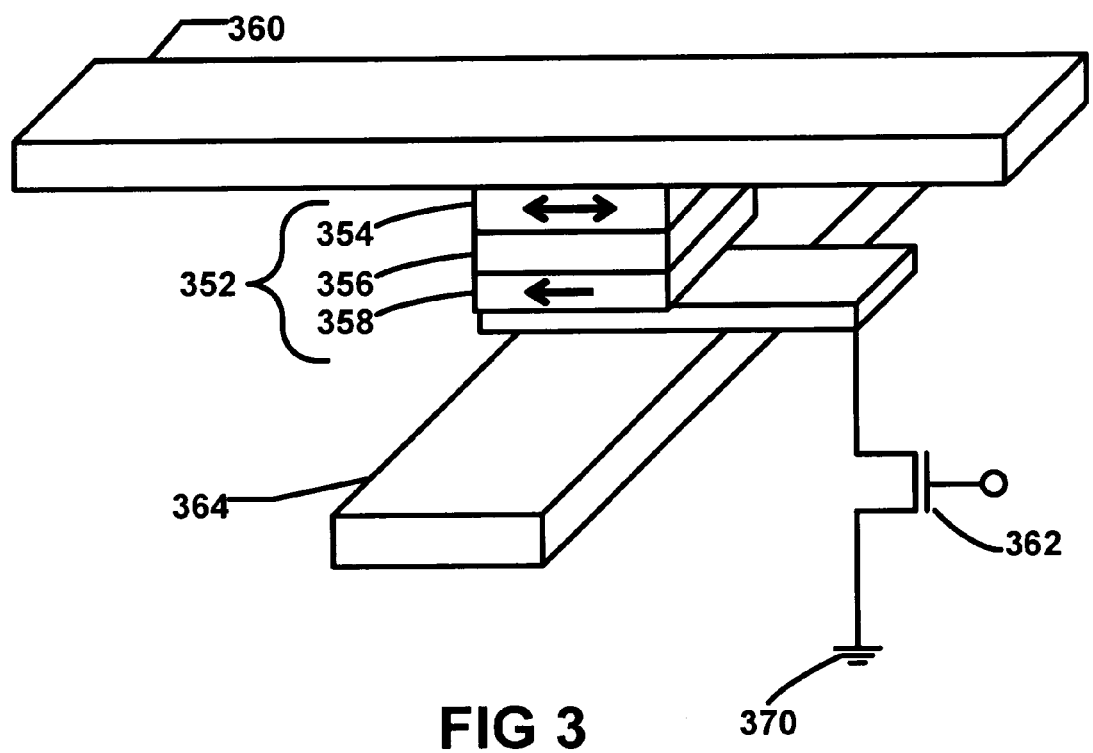
FIG. 3 is a perspective view of a reference element having uncladded program lines according to an embodiment of the invention.

In other embodiments, the operational element may take various forms such as a spin valve, pseudo spin valve, or ring-shaped element, for instance. The memory cell shown in FIG. 3 is a 1MJT/1 Transistor cell (1R/1T). Other configurations of MRAM cells may be used 2R/2T, 2R/5T, etc.

Reference elements are used during a read sequence to determine the logical state of operational elements and may also be used for other purposes. It is preferable to have reference elements that are completely identical in behavior to operational elements—including temperature variability and other sensitivities. However, the logical state of reference elements should not be easily switched. According to the embodiment, switching is avoided in the reference elements by ensuring that program lines of the reference elements are uncladded.

FIG. 3 is a perspective view of showing relative orientation of a reference element having uncladded program lines. Here, the reference element 352 is a magnetic tunnel junction. The reference element 352 includes a free layer 354, tunnel barrier 356 (e.g., a dielectric), and fixed layer 358. A first side of the reference element 352 is coupled to an uncladded bit line 360 while a second side of the reference element 352 is coupled to ground 370 via a switch 362 (e.g., a transistor).

An uncladded digit line 364 is arranged near the reference element 352, but is electrically insulated from the reference element 352. As shown, the uncladded bit line 360 and uncladded digit line 364 may be arranged so that one line runs perpendicularly to the other.

The uncladded bit line 360 and uncladded digit line 364 are collectively termed 'program lines' as they may be used to switch (toggle) and/or read the logical state of the reference element 302.

In an embodiment, a reference cell includes four reference elements and is used to create a signal that is half-way between the high and low resistance. The four elements are arranged in a series-parallel combination such that each reference element pair connected in series are programmed such that one element of the pair has the opposite logical state to the other element of the pair. In an alternative embodiment, the reference cell may be a single reference element, a single pair of reference elements in series, or may be any number of reference elements.

Figure 4:
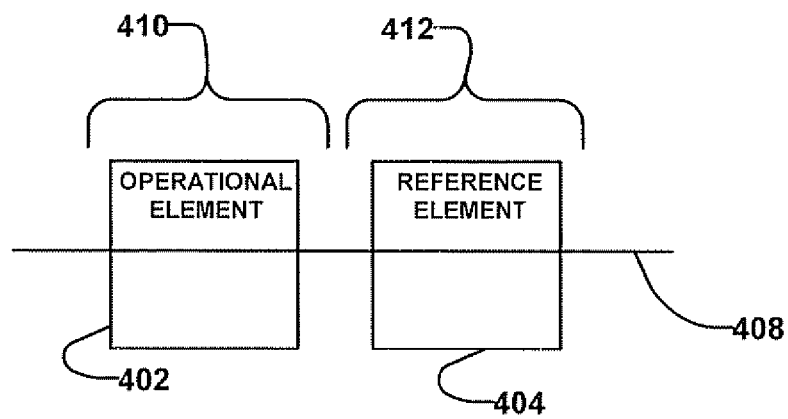
FIG. 4 is a schematic showing an MRAM array according to an embodiment of the invention.

FIG. 4 shows an exemplary embodiment of an MRAM circuit having a single operational element 402 and a single reference element 404. A program line 408 is arranged to pass near both the operational element 402 (operational region 410) and near the reference element 404 (reference region 412). The operational region 410 of the program line 408 is cladded while the reference region 412 near the reference region is uncladded. Thus, in an embodiment, flux-concentration cladding is only applied to regions of the MRAM circuit where operational MRAM elements are located and not to regions where reference MRAM elements are located.

Figure 5:
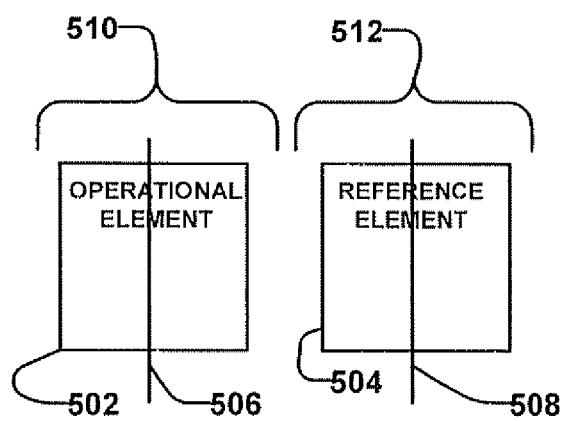
FIG. 5 is a schematic showing an MRAM array according to another embodiment of the invention.

FIG. 5 shows another exemplary embodiment of an MRAM circuit having a single operational element 502 and a single reference element 504. A first program line 506 is cladded and arranged to pass near the operational element 502 within the operational region 510. A second program line 508 is uncladded and arranged to pass near the reference element 504 within the reference region 512. Thus, in an embodiment, flux-concentration cladding is only applied to program lines for operational elements and not for reference elements.

Because unclad program lines do not focus the generated magnetic field, in an embodiment additional physical separation may be required between the reference region and the operational region to ensure that a stray generated magnetic field does not toggle any operational elements. More specifically, in FIG. 5, the operational element 502 may be physically separated from the reference element 504.

A first current generator circuitry (e.g., VDD) may be configured for supplying a current to the first program line for toggling the operational element. Thus, in FIG. 5, an end of the first program line 506 may be coupled with the first current generator circuitry.

As discussed above, toggling an MRAM element using an unclad program line requires more current than would toggling the element using a cladded program line. Because program lines associated with reference elements are unclad, a higher voltage is preferably used when toggling is required (perhaps only at the factory). According to an embodiment, an additional supply voltage (e.g., 5V) which is higher than the MRAM circuit VDD (e.g., 3.3V) may be implemented for the purpose of setting the reference bits in manufacturing. The additional supply voltage, which may be used for resetting the reference bit, can be brought out to a pad on the package for training personnel to reset the reference bit. On the other hand, this additional voltage signal can be unpadded at the package level to avoid access of setting the reference bit. Since the higher voltage is only used when setting reference bits, the power consumption and specification of the MRAM device should not be affected. Likewise, the second current generator may be an external current generator circuitry that is normally uncoupled with the second program line.

FIGS. 4 and 5 are simple examples to provide general concepts of the invention. More broadly, the MRAM circuit may contain an MRAM array that includes a plurality of operational MRAM elements. A reference cell in the MRAM circuit may include one or more reference MRAM elements. In this embodiment, a plurality of program lines may be provided throughout the MRAM circuit and used in switching/reading the elements. Portions of the program lines within a first region (associated with the operational MRAM elements) are cladded while portions of the program lines in a second region (associated with the reference cell) are uncladded. As discussed, the cladded program lines may include a flux-concentrating layer configured to focus a generated magnetic field on particular operational elements. To avoid inadvertent toggling of operational elements, the first region may be separated from the second region.

Figure 6:
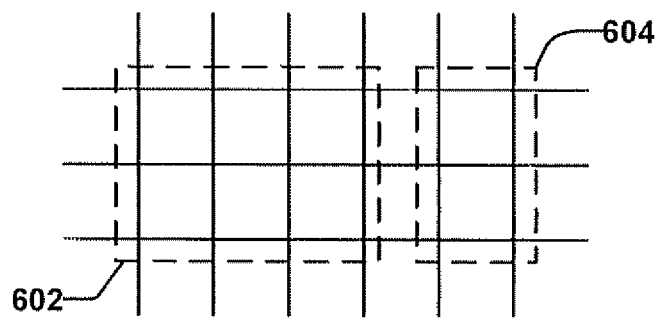
FIG. 6 is a schematic showing an MRAM device according to another embodiment of the invention.

FIG. 6 is a schematic showing an MRAM device according to another embodiment of the invention. A first region 602 includes an MRAM array with a plurality of operational MRAM elements. A second region 604 includes a reference cell with one or more reference MRAM elements. A plurality of program lines are shown as a grid passing through both the first region 602 and the second region 604. Portions of program lines within the first region 602 are cladded while portions of program lines within the second region 604 are uncladded. In an alternative embodiment, program lines that pass through the first region 602 are cladded while program lines that pass through the second region 604 and do not pass through the first region 602 are uncladded.

I claim:

1. An MRAM circuit comprising:
   a cladded region of a program line arranged near an operational MRAM element; and
   an uncladded region of the program line arranged near a reference MRAM element.

2. The MRAM circuit of claim 1, wherein cladded region includes a flux concentrating cladding to for focusing a generated magnetic field.

3. The MRAM circuit of claim 1, wherein the operational MRAM element exhibits substantially the same physical properties as the reference MRAM element.

4. The MRAM circuit of claim 1, wherein MRAM elements are MTJ's.

5. The MRAM circuit of claim 1, wherein the MRAM elements are spin valves.

6. The MRAM circuit of claim 1, wherein the reference MRAM element is physically separated from the operational MRAM element such that a magnetic field in the uncladded region sufficient to toggle the reference MRAM element would not toggle the operational MRAM element.

7. An MRAM circuit comprising:
   an MRAM array including a plurality of operational MRAM elements;
   a reference cell including one or more reference MRAM elements;
   a plurality of program lines wherein each of the program lines includes a first region that is cladded and a second region that is uncladded, and wherein the first region is associated with the operational MRAM elements and the second region is associated with the reference cell.

8. The MRAM circuit of claim 7 wherein the first region includes a flux-concentrating layer configured to focus a generated magnetic field.

9. The MRAM circuit of claim 8 wherein the flux-concentrating layer includes a thin layer soft ferromagnetic material integrated into an inlaid copper interconnect.

10. The MRAM circuit of claim 7, wherein the second region is separated from the first region such that a magnetic field generated within the second region would not normally toggle any of the operational MRAM elements.

11. The MRAM circuit of claim 7, wherein a temperature sensitivity of the operational MRAM elements is substantially identical to a temperature sensitivity of the reference MRAM elements.

12. A memory device comprising:
    a first magnetoresistive element configured for storing a datum;
    a second magnetoresistive element configured for serving as a reference;
    a program line disposed near the first magnetoresistive element and the second magnetoresistive element, wherein the program line includes a first cladded region configured to focus a generated magnetic field and a second uncladded region configured to create an unfocused generated magnetic field.

13. The memory device of claim 12 wherein the first magnetoresistive element is an MRAM element.

14. The memory device of claim 13 wherein the MRAM element includes two ferromagnetic layers separated by a dielectric layer.

* * * * *